(12) United States Patent
Mai

(10) Patent No.: US 8,242,828 B1
(45) Date of Patent: *Aug. 14, 2012

(54) PROGRAMMABLE DELAY CIRCUIT

(75) Inventor: Rifeng Mai, Sunnyvale, CA (US)

(73) Assignee: Marvell International Ltd. (BM)

( * ) Notice: Subject to any disclaimer, the term of this patent is extended or adjusted under 35 U.S.C. 154(b) by 299 days.

This patent is subject to a terminal disclaimer.

(21) Appl. No.: 12/616,393

(22) Filed: Nov. 11, 2009

Related U.S. Application Data

(63) Continuation of application No. 11/607,641, filed on Dec. 1, 2006, now Pat. No. 7,619,457.

(60) Provisional application No. 60/760,576, filed on Jan. 20, 2006.

(51) Int. Cl.
*H03H 11/26* (2006.01)

(52) U.S. Cl. .......................... 327/276; 327/264; 327/278

(58) Field of Classification Search .......... 327/276–278, 327/281, 284, 285, 261, 263, 264
See application file for complete search history.

(56) References Cited

U.S. PATENT DOCUMENTS

| | | | |
|---|---|---|---|
| 5,051,630 A * | 9/1991 | Kogan et al. ................. | 327/262 |
| 5,081,380 A | 1/1992 | Chen ............................. | 327/262 |
| 5,459,424 A * | 10/1995 | Hattori ......................... | 327/278 |
| 6,060,930 A | 5/2000 | Choi ............................. | 327/276 |
| 6,121,811 A | 9/2000 | Scott et al. ................... | 327/276 |
| 6,348,827 B1 | 2/2002 | Fifield et al. ................ | 327/278 |
| 6,407,601 B1 | 6/2002 | Lin ............................... | 327/158 |
| 6,525,586 B1 | 2/2003 | Ahmed et al. ............... | 327/280 |
| 6,987,407 B2 | 1/2006 | Chung et al. ................. | 327/158 |
| 7,042,266 B2 * | 5/2006 | Takahashi ..................... | 327/288 |
| 7,084,684 B2 * | 8/2006 | Kim et al. .................... | 327/276 |
| 7,619,457 B1 * | 11/2009 | Mai ............................... | 327/276 |
| 7,932,764 B2 * | 4/2011 | Chou ............................ | 327/268 |

* cited by examiner

*Primary Examiner* — Hai L Nguyen
(74) *Attorney, Agent, or Firm* — Brinks Hofer Gilson & Lione

(57) ABSTRACT

A delay circuit is described having a variable capacitor and a triggering circuit. The variable capacitor and the triggering circuit may both include transistors. With both the variable capacitor and the triggering circuit dependent on the threshold voltage, the delay circuit may be less sensitive to process variations. The delay circuit may also include a capacitor, a first triggering circuit, a second triggering circuit, and a pull down circuit. The capacitor may discharge at a first rate, triggering the first triggering circuit which, in turn, activates the pull down circuit to pull down the capacitor at a second rate that is faster than the first rate. The second triggering circuit is triggered as the capacitor is pulled down, thereby reducing the effect of input signal noise on the output of the delay circuit. The discharging of the capacitor may be adjusted by a control input thereby making the delay of the delay circuit programmable.

20 Claims, 13 Drawing Sheets

PROGRAMMABLE DELAY CIRCUIT

CROSS-REFERENCE TO RELATED APPLICATION

This application is a continuation of application Ser. No. 11/607,641, filed Dec. 1, 2006, now U.S. Pat. No. 7,619,457, which issued on Nov. 17, 2009, which is hereby incorporated by reference. This application claims the benefit of U.S. Provisional Application No. 60/760,576, filed Jan. 20, 2006, and the entirety of this application is hereby incorporated by reference.

BACKGROUND

Delay circuits are often used in modern chip and system designs to provide a predetermined delay for an input signal. The delay circuits may be used for a variety of applications, such as sampling clock phase optimization for analog to digital converters.

One example of a known delay circuit utilizes an inverter cell that generates a predetermined delay. Multiple inverter cells may be coupled together in the form of a chain, with the delay from each cell adding up to a required time delay for the entire chain of cells. The inverter delay cell is simple to implement but is very sensitive to process, power supply voltage and ambient temperature variations. Because of the sensitivity of the inverter delay cell, the programmable delay step variation is on the order of 50%. This variation makes the standard inverter delay cell impractical.

In order to reduce the variation, the basic inverter cell has been modified. One modification uses the inverter delay cell 100 as shown in FIG. 1. The inverter delay cell 100 includes an inverter 110, a constant current $I_{IC1}$, and a capacitor $C_{IC1}$. The constant current $I_{IC1}$ is a reference source current that is independent of the process chosen, and thus is not susceptible to process variations. The delay generated by the inverter delay cell 100 is dependent on the constant current $I_{IC1}$ and the capacitor $C_{IC1}$. Specifically, in operation, when the input signal to the inverter 110 goes high, the discharge time for the capacitor depends on the constant current $I_{IC1}$ and the capacitor $C_{IC1}$.

Another modification to the basic inverter cell is shown in FIG. 2. Rather than receiving a reference source current independent of process, the current for the delay cell 202 is generated by a self-biased current generator 200, thereby reducing variation based on process. However, the self-biased technique still requires complicated calibration to reduce the effects of temperature variation. And, the delay cell 202 is still susceptible to variation based on process. For example, the characteristics of the discharge capacitor $C_{IC2}$ may still depend on the process variations. Further, as in other delay circuits that rely on multiple, cascaded delay cells, the delay step linearity, sometimes called differential nonlinearity (DNL), may be worse with the increase of delay step due to the accumulation of delay error of each delay cell.

Another type of delay circuit is a delay-locked loop (DLL). Where an accurate reference clock is available, the delay-locked loop may be used to generate the required delay step, the accuracy of which being determined by the reference clock period. However, the DLL design may consume power and area, particularly in the case where the required delay step is quite small compared to the clock period since a long voltage control delay line (VCDL) is needed. Moreover, the accurate reference clock is not always available.

Accordingly, it would be desirable to develop a novel delay circuit which is less sensitive to process, voltage and/or temperature (PVT) variations and small differential nonlinearity.

SUMMARY

The present invention is defined by the attached claims, and nothing in this section should be taken as a limitation on those claims. According to one aspect, a delay circuit that may be less sensitive to process variations is provided. The delay circuit comprises a capacitor in communication with a triggering circuit. The capacitor may have a threshold voltage, with the capacitance of the capacitor being dependent, at least in part, on the threshold voltage. For example, the capacitor may include a first transistor, such as a MOS transistor. The drain and source of the first transistor may be coupled together, such as connected to VDD or VSS. The triggering circuit may be in communication with the capacitor, with the triggering circuit generating an output when the discharging capacitor reaches a triggering voltage. The triggering voltage of the triggering circuit may also be dependent, at least in part, on the threshold voltage. For example, the triggering circuit may include a second transistor with the same threshold voltage as the first transistor used for the capacitor. In delaying an input signal, a rising or falling edge of input signal may begin to discharge the capacitor. As the voltage on the capacitor discharges to the triggering voltage, the triggering circuit generates an output. Process variations may affect the threshold voltage of the transistor, and, in turn, may affect the individual portions of the delay circuit, such as changing the capacitance of the capacitor and changing the triggering voltage of the triggering circuit. Because the changes to the capacitance and the triggering voltage tend to work inversely to one another, the changes due to the process variations of the two portions tend to cancel one another out. Thus, the operation of the delay circuit may be less dependent on process variations.

In another aspect of the invention, a delay circuit that includes multiple triggering circuits is provided. The delay circuit may include a capacitor, a first triggering circuit (with a first triggering voltage), a second triggering circuit (with a second triggering voltage), and a pull down circuit. The discharging node of the capacitor is coupled to the inputs of the first triggering circuit and the second triggering circuit. The pull down circuit is coupled between the output of the first triggering circuit and the discharge node of the capacitor. In operation, the discharging node of the capacitor may discharge at a first rate (such as an exponential rate). When the discharging node reaches a first triggering level, the first triggering circuit generates an output. In turn, the pull down circuit senses the output from the first triggering circuit, and pulls down the discharging node at a second rate, with the second rate being faster than the first rate. The second triggering circuit generates an output for the delay circuit when the discharging node, discharging at the steeper second rate, reaches the second triggering level, thereby reducing the effect of input signal noise on the output of the delay circuit.

In still another aspect of the invention, a programmable delay circuit is provided. The delay circuit may include a delay cell comprising a variable current source, a capacitor, an edge detector circuit for coupling the capacitor to the variable current source when an edge is detected in the input signal, and a triggering circuit for generating an output. The rate at which the capacitor discharges is dependent, at least in part, on the amount of current generated by the variable current source that is coupled to the discharging capacitor. The variable current source may receive a signal that determines the amount of current generated by the variable current source, and in turn the amount of delay for the delay cell. The signal received by the variable current source may be dependent on a control signal, such as a digital control signal. In this manner, a single delay cell may generate different delay times based on the control signal. Thus, only one delay cell may be used to delay an edge of the input signal rather than cascading multiple delay cells together.

The following description will now be described with reference to the attached drawings.

DETAILED DESCRIPTION

Figure 1:
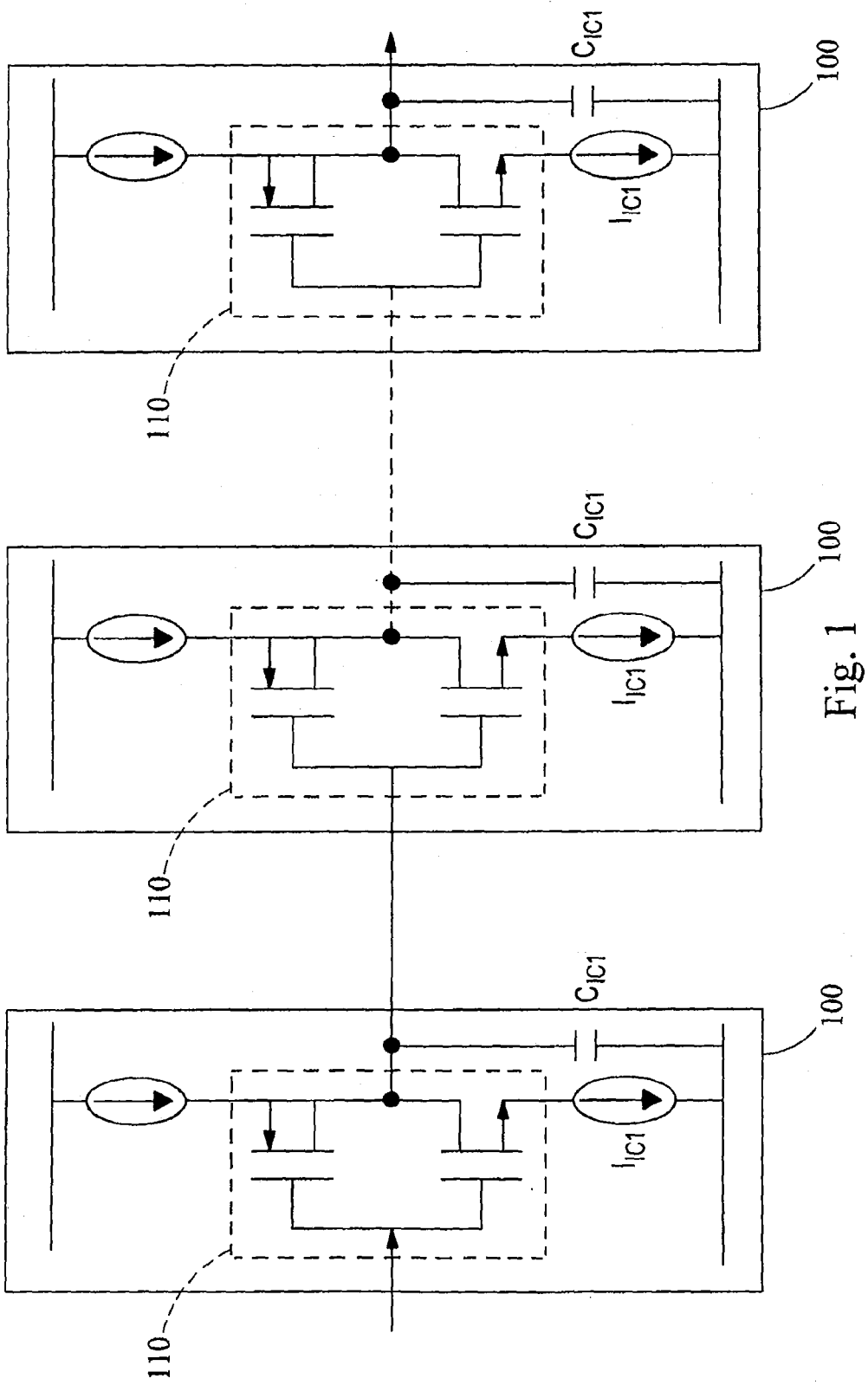
FIG. 1 is a circuit diagram of a prior art delay circuit.
Figure 2:
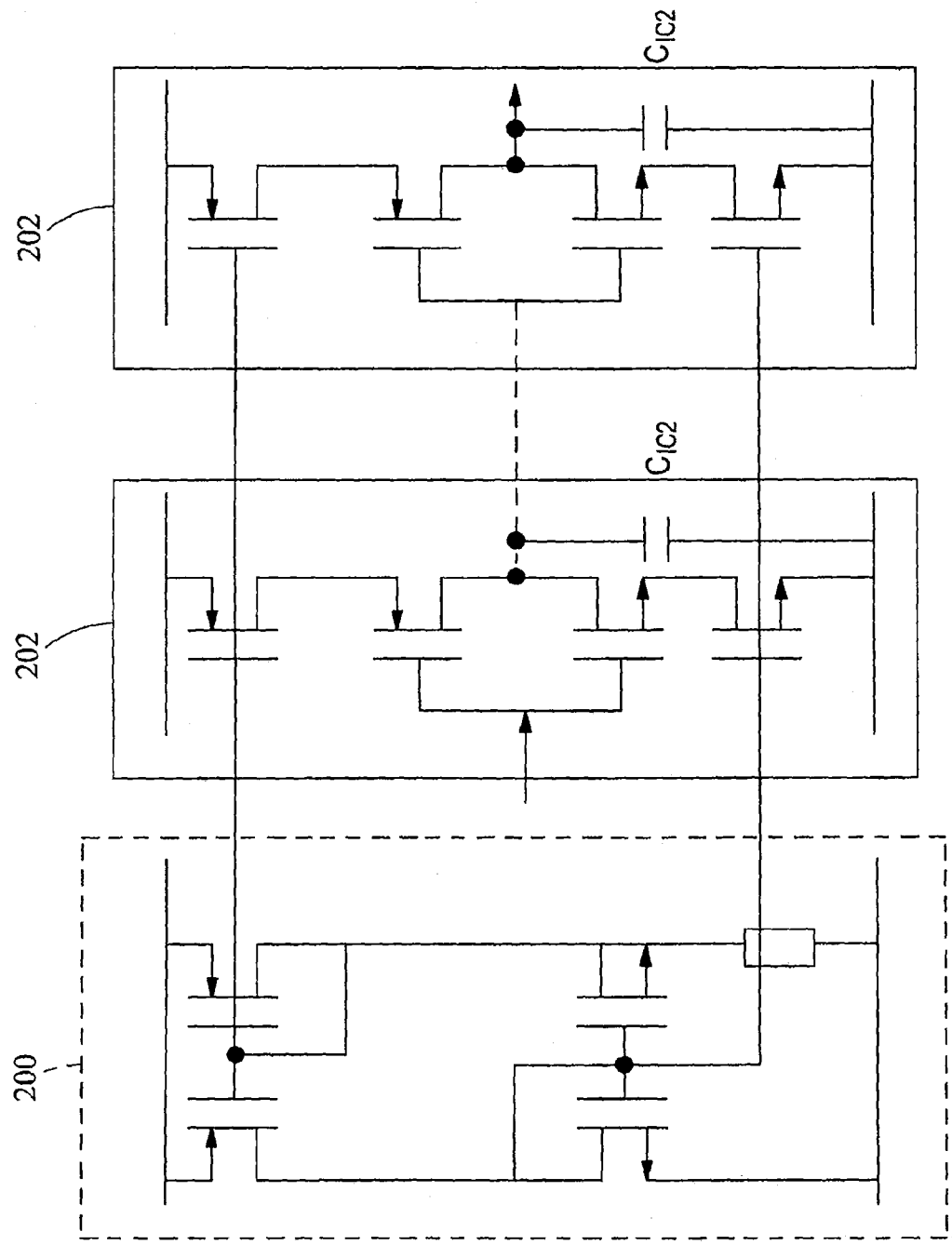
FIG. 2 is a circuit diagram of a prior art self biased delay circuit.
Figure 3:
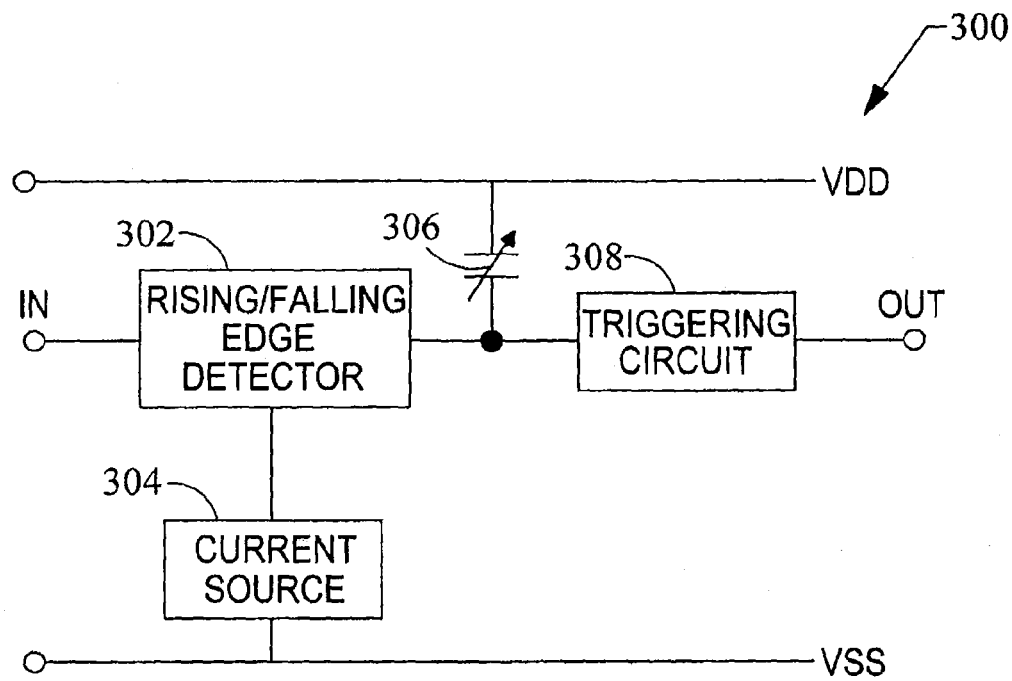
FIG. 3 is a circuit diagram of a delay cell according to one embodiment.

Referring to FIG. 3, an example of a delay cell 300 is shown. The delay cell 300 includes an input node (IN) that may be coupled to an input signal. As discussed in more detail below, the collective operations of the rising/falling edge detector 302, the current source 304, the variable capacitor 306 and the triggering circuit 308 may delay the input signal by a predetermined time, which may then be output at an output node (OUT).

Figure 13:
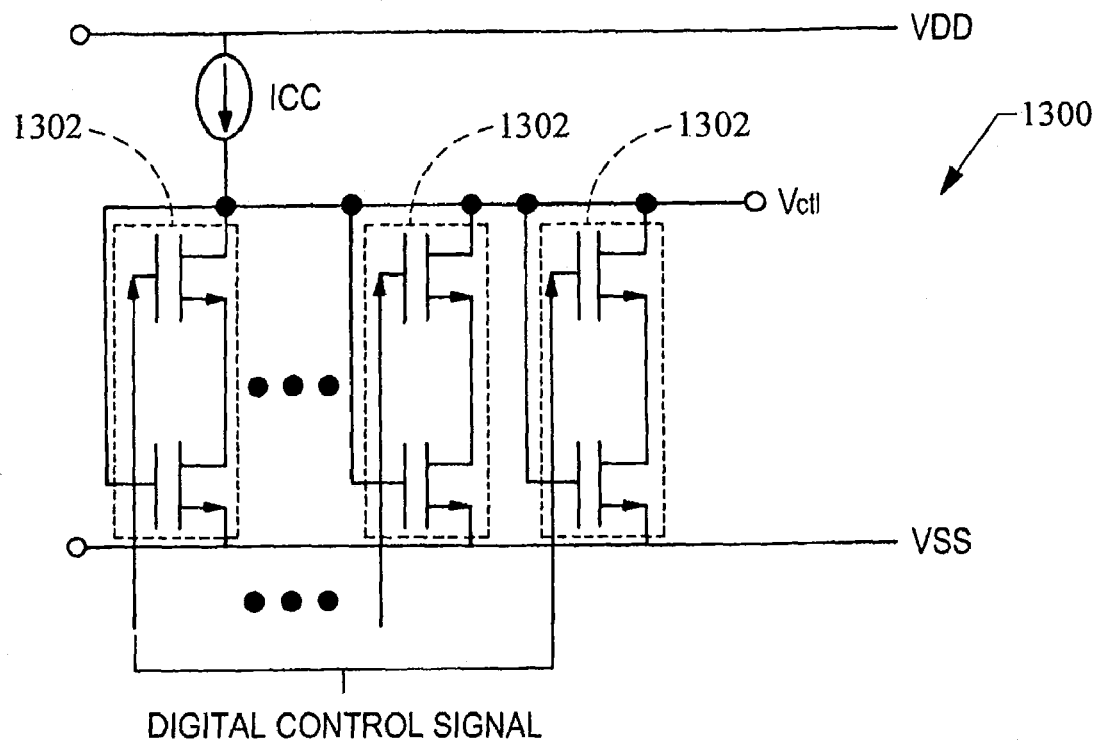
FIG. 13 is a circuit diagram of a digital controlled current-to-voltage converter and a reference current.

The input signal may include a rising edge, transitioning from a LOW value (such as 0V) to a HIGH value (such as 5V), and a falling edge, transitioning from the HIGH value to the LOW value. The rising/falling edge detector 302 may detect one or both of the rising and falling edges of the input signal. An example of a rising edge detector, discussed in more detail below, is depicted as inverter M1 and M2 in FIG. 5. An example of a falling edge detector is depicted as inverter 902 in combination with inverter M1 and M2 in FIG. 11. After sensing the rising/falling edge of the input signal, the rising/falling edge detector 302 may couple the current source 304 to the variable capacitor 306, thereby discharging variable capacitor 306. Current source 304 is adapted to generate a current that may vary (such as by being programmable, as depicted in FIG. 13) or may be static. If the current in the current source 304 varies, the amount of current may control the rate of discharge of the variable capacitor 306, and in turn the delay for the delay cell 300. In this manner, a single delay cell 300 may be used to generate a predetermined time delay in response to the current selected for current source 304, thereby obviating the need to cascade multiple cells. Alternatively, the current in the current source 304 may be static, and the delay cells may be cascaded to generate the desired time delay.

Figure 5:
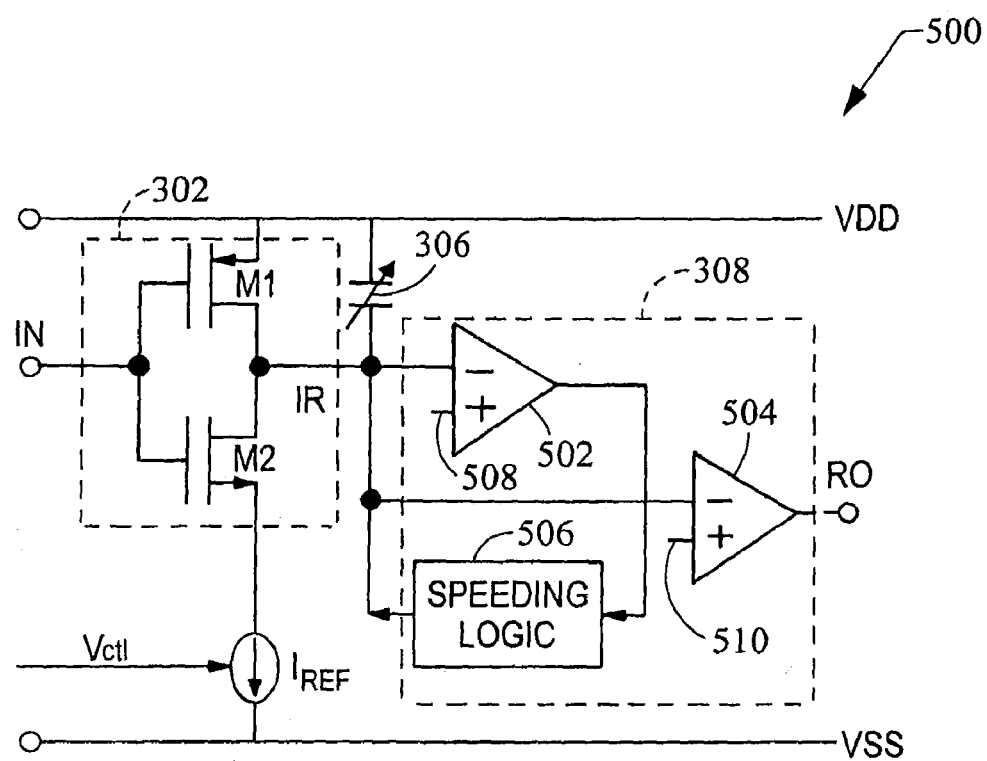
FIG. 5 is a circuit diagram of a rising edge delay cell according to the embodiment depicted in FIG. 3.

A first node of the variable capacitor 306 may be coupled to VDD (which may be 5V). A second node of the variable capacitor 306 may be coupled to rising/falling edge detector 302 and to the triggering circuit 308, as shown in FIG. 3. The capacitance of the variable capacitor 306 may vary depending on the voltage applied across the variable capacitor 306. The triggering circuit 308 may include a triggering voltage at which the output is transitioned. For example, the triggering circuit 308 may comprise a comparator 502 with a reference voltage 508, as depicted in FIG. 5. The reference voltage 508, as shown in FIG. 5, may be input to one of the terminals of the comparator 502 (such as the "+" terminal). The comparator 502 may compare the voltage of the discharging variable capacitor 306 with the reference voltage, and output a voltage when the voltage of the discharging variable capacitor 306 reaches the reference voltage.

As discussed above, process variations may alter the characteristics of one or more elements in the delay cell 300. For example, the variable capacitor 306 or the triggering circuit 308 in the delay cell 300 may vary depending on the process variations. Specifically, even if the steps in a process are the same, one run of the steps may produce a first threshold voltage and a second run of the steps may produce a second threshold voltage that is different from the first threshold voltage. In one embodiment, the variable capacitor 306 and the triggering circuit 308 may be adapted to reduce variations in the time delay of the delay cell 300 due to the process variations. Specifically, the variable capacitor 306 and the triggering circuit 308 may be selected such that the time at which the triggering circuit 308 triggers is approximately independent of the process variations. If the process variations affect the triggering voltage of the triggering circuit 308 (either by increasing or decreasing the triggering voltage), the variable capacitor 306 may at least partly compensate for the change in the triggering voltage of the triggering circuit 308 (either by decreasing or increasing the capacitance of the variable capacitor 306).

As discussed in more detail below, the triggering circuit 308 may include one or more MOS transistors that activate based on a threshold voltage ($V_t$) of the transistor (see, for example, transistor M4 in FIG. 6). The fabrication process may affect $V_t$, thereby affecting when the MOS transistor activates. To reduce the variance from inexact activation of the MOS transistor of the triggering circuit 308, the capacitance of the variable capacitor 306 may be varied based on $V_t$ as well (but in an opposite manner) to compensate for the change in the threshold voltage of the MOS transistor. For example, the MOS transistor may have a first threshold voltage at which the triggering circuit 308 is triggered. If a process results in a decreased threshold voltage for the MOS transistor, the capacitance of the variable capacitor 306, also dependent on the threshold voltage, may be increased so that the MOS transistor will trigger at approximately the same time, thereby causing the overall time delay of the delay cell 300 to remain the same. Likewise, if a process results in an increased threshold voltage for the MOS transistor, the capacitance of the variable capacitor 306 may be decreased so that the MOS transistor will trigger at approximately the same time, again causing the overall time delay of the delay cell 300 to remain the same. In this manner, the time delay for the delay cell 300 may vary less from one fabrication to the next.

Figure 4:
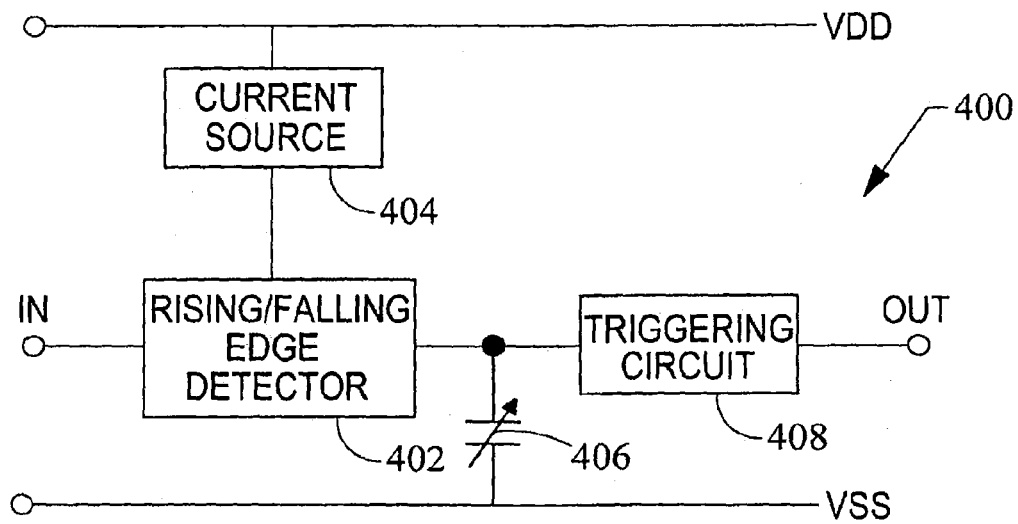
FIG. 4 is a circuit diagram of a delay cell according to another embodiment.

FIG. 4 is a circuit diagram of the delay cell 400 according to another embodiment. Similar to the delay cell 300 depicted in FIG. 3, the delay cell 400 includes an input node (IN) coupled to a rising/falling edge detector 402, a current source 404, a variable capacitor 406 and triggering circuit 408. Unlike the delay cell 300 depicted in FIG. 3, in the delay cell 400, the variable capacitor 406 is coupled to VSS and the current source is coupled to VDD. The delay cell 300 depicted in FIG. 3 may be implemented using a variable capacitor 306 that includes a PMOS transistor while the delay cell 400 depicted in FIG. 4 may be implemented using a variable capacitor 406 that includes an NMOS transistor.

FIG. 5 depicts a circuit diagram of a rising edge delay cell 500 according to the embodiment depicted in FIG. 3. The rising edge delay cell 500 may include a current starved inverter including transistors M1 and M2 that may act as a rising edge detector. As discussed in FIG. 11, transistors M1 and M2 may be used in combination with an inverter to act as a falling edge detector. Prior to the rising edge of the input signal, the variable capacitor 306 may be precharged through transistor M1 of the current starved inverter. After which, the input signal may transition from LOW to HIGH (i.e., assume signal IN is LOW initially at (t=0−); at t=0+, IN goes HIGH). When the input signal is high, transistor M2 of the current starved inverter is ON, and node IR discharges from HIGH to LOW. The rate of discharge of node IR may depend on the capacitance of variable capacitor 306 and the current from current source $I_{REF}$. The capacitance of the variable capacitor 306 may be a function of the voltage across it (capacitance C=f(V)). Further, a single process may produce transistors of different characteristics, such as different $V_t$. For example, a single process may produce transistors characterized as slow-slow (ss) (which reflects a higher $V_t$ than normal), or may produce transistors characterized as typical-typical (tt) (which reflects a normal $V_t$), or may produce transistors characterized as fast-fast (ff) (which reflects a lower $V_t$ than normal). As discussed above, different threshold voltages may produce different capacitances for the variable capacitor 306. One example of the variable capacitor 306 may include a transistor, such as a PMOS transistor with the source and drain both connected to VDD so that the source and drain are shorted together, discussed below in FIG. 6. Alternatively, the variable capacitor may comprise an NMOS transistor with the source and drain tied to VSS, such as variable capacitor 406 shown in FIG. 4.

Figure 14:
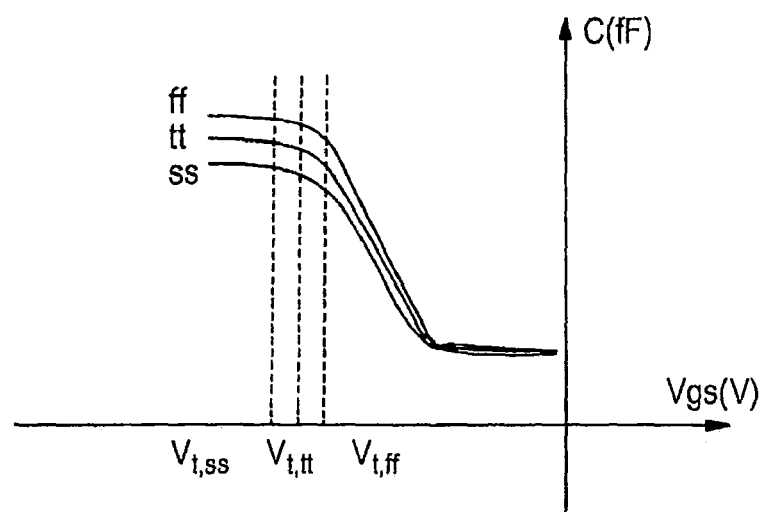
FIG. 14 is a graph of the voltage dependence of a capacitance under processes (ss, tt, ff) that generate different thresholds.

FIG. 14 is a graph of the voltage dependence of the capacitance of the variable capacitor for different process variations (ss, tt, ff). As shown in FIG. 14, the charging curves are different for different process variations; therefore, the variable capacitor 306 may discharge differently depending on the process variations.

FIG. 5 also shows an example of a triggering circuit 308. The triggering circuit 308 may comprise one or more comparators. For example, FIG. 5 shows a triggering circuit 308 comprising a first comparator 502 (acting as a first triggering circuit), a second comparator 504 (acting as a second triggering circuit), and speeding logic 506. As discussed in more detail below, the second comparator 504 and the speeding logic 506 may be used to increase the noise immunity of the rising edge delay cell 500. However, the second comparator 504 and the speeding logic 506 are not required to operate the triggering circuit 308 in FIG. 5.

As shown in FIG. 5, the first comparator 502 includes two inputs, one input connected to node IR and another input that acts as a reference voltage 508. The reference voltage may be generated by the first comparator 502 (e.g., self biased) or may be generated external to the first comparator 502. Similar to the variable capacitor 306, the operation of the first comparator 502 may depend on $V_t$. For example, the $V_t$ at which the first comparator 502 triggers may vary due to process variations. Specifically, the threshold voltage for the first comparator 502 may be higher for ff process variation than for ss process variation.

Individually, both the variable capacitor 306 and the first comparator 502 are dependent on the variations fabrication process. Taken together, the variations for the fabrication process for the variable capacitor 306 and the first comparator 502 track to one another, tending to reduce the fabrication process dependence of the rising edge delay cell 500 as a whole. For example, a fabrication process resulting in ff (fast-fast) may reduce the capacitance of the variable capacitor 306 and increase the threshold voltage for triggering an output of the first comparator 502. A fabrication process resulting in ss (slow-slow) may increase the capacitance of the variable capacitor 306 and decrease the threshold voltage of the first comparator 502.

Figure 15:
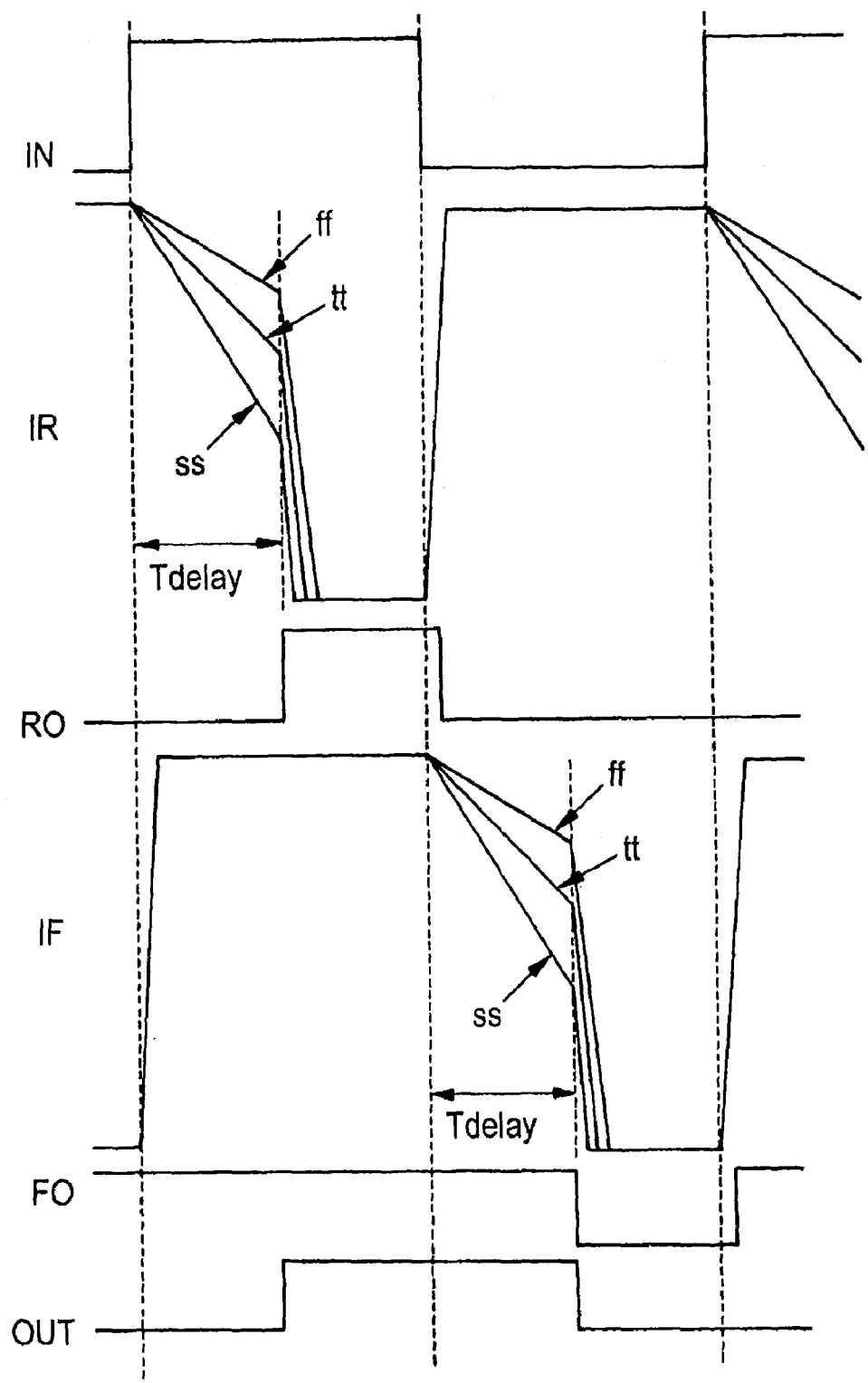
FIG. 15 is a graph of the timing relationship of a programmable delay circuit according to an embodiment of the present invention under processes (ss, tt, if) that generate different thresholds.

The result is that the time delay ($T_{delay}$) for the rising edge delay cell 500, which is based on the combination of the discharging of the variable capacitor 306 and the triggering of the first comparator 502, is substantially the same regardless of the results of the fabrication process (whether resulting in ff, ss or tt). This is shown in the timing diagram shown in FIG. 15. Specifically, FIG. 15 depicts the voltage curves for various nodes in FIG. 5, including the nodes for IN and IR. When the input signal (IN) goes HIGH, node IR begins to discharge. As shown in FIG. 15, the discharge rate for node IR is different based on the result of the fabrication process (e.g., ff, tt, ss). As further shown in FIG. 15, the time delay ($T_{delay}$) is approximately the same for each result. This is due to the first comparator 502 triggering at different threshold voltages ($V_t$) for the different results of the fabrication process. For example, in a fabrication process resulting in ff, the discharge rate is slower, but the $V_t$ is higher, so that the first comparator 502 triggers at approximately the same time as a circuit made from a fabrication process resulting in a different threshold voltage.

In addition to process insensitivity, the rising edge delay cell 500 may also track temperature sensitivity in the same way. Specifically, each of the variable capacitor 306 and the first comparator 502 may be temperature sensitive, with the combined operation of the variable capacitor 306 and the first comparator 502 tracking to one another, thereby reducing or eliminating the temperature sensitivity of the rising edge delay cell 500. Further, the rising edge delay cell 500 may be insensitive to power supply variations by providing a regulated VDD.

The time delay ($T_{delay}$) may be estimated by:

$$T_{delay} = \lim_{N \to \infty} \sum_{i=1}^{N} \frac{\int_{V(t(i))}^{V(t(i)+\Delta t)} C(V(t(i))dV(t(i))}{I_{REF}(t(i))} \quad (1)$$

where, $I_{REF}$ is the reference current, $t(i)=t(i-1)+\Delta t$; $I_{REF}(t(i))=I_{REF}$ if $i>K>1$; $I_{REF}(t(i))>I_{REF}$ if $i \leq K$; $V(t(i))=V_{IR}(t(i))$, where K is indicative of the time period. The value of K may be kept as small as possible because during the period when $i \leq K$, $I_{REF}(t(i))$ is undefined. When $i>K$, the reference current is settled and kept constant at $I_{REF}$. At this time, the time delay ($T_{delay}$) may be expressed as:

$$T_{delay} = \frac{\lim_{N \to \infty} \sum_{i=1}^{N} \int_{V(t(i))}^{V(t(i)+\Delta t)} C(V(t(i))dV(t(i))}{I_{REF}} \quad (2)$$

Figure 9:
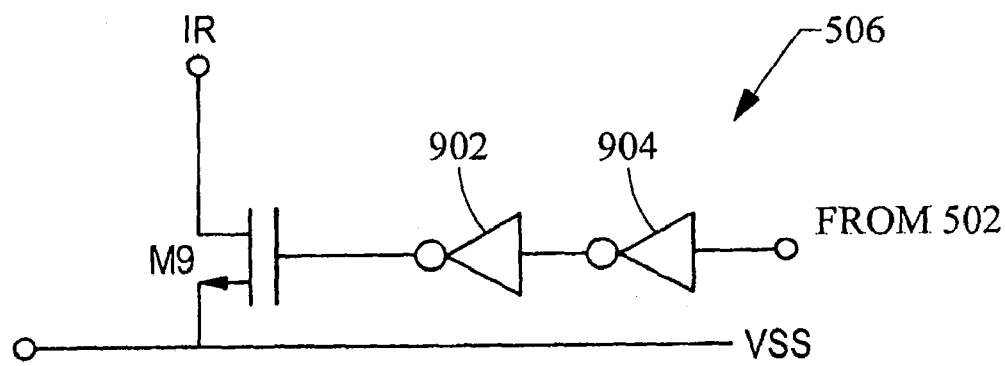
FIG. 9 is a circuit diagram of the speeding logic depicted in FIG. 5.
Figure 10:
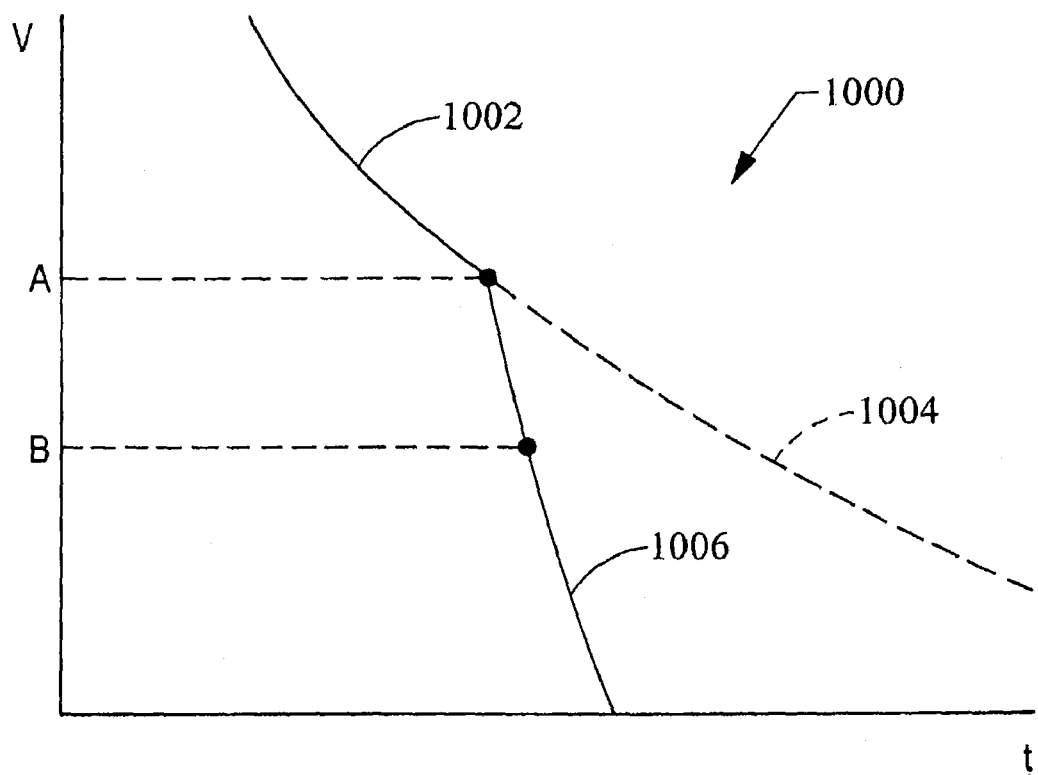
FIG. 10 is a graph of the voltage over time at node IR in FIG. 5

As discussed above, the triggering circuit 308 may include speeding logic 506 and a second comparator 504. In order to speed up the rising edge delay cell 500, speeding logic 506 may be used. The speeding logic 506, an example of which is shown in FIG. 9, forms a local loop to quickly modify the voltage at the junction of the variable capacitor 306 (such as by pulling down the voltage of node IR to VSS). The node IR of the variable capacitor 306 discharges at an exponential rate. The curve 1000 of the voltage at node IR is shown in FIG. 10. A first section of the curve 1002 shows the exponential decay of the voltage over time. When the voltage at node IR hits the triggering voltage of the first comparator 502 (designated as point "A" in FIG. 10, the first comparator 502 changes its output signal by outputting a decision pulse. Once the decision pulse is generated, it is unnecessary to keep the charging behavior as before. Specifically, it is unnecessary for node IR to continue discharging at an exponential rate (denoted as dashed curve 1004 in FIG. 10). Thus, the speeding logic 506 is used to reset the voltage at node IR to VSS. As shown in FIG. 10 at curve 1006, the voltage at node IR is pulled down to 0V. The slope of curve 1006 is much steeper than the slope of curve 1004. Because of the steepness of curve 1006, the rising edge delay cell 500 is more immune to noise on the input signal (IN).

Further, to avoid a potential mis-trigger due to the speeding logic 506, a second comparator 504 is used. The second comparator 504, similar to the first comparator 502, may include two inputs, one input connected to node IR and another input 510 that acts as a reference voltage. The reference voltage may be generated by the second comparator 504 (e.g., self biased) or may be generated external to the second comparator 504. The threshold voltage of second comparator 504 may be different than the threshold voltage of the first comparator 502. For example, the threshold voltage of the second comparator 504 may be slightly lower than the threshold voltage of the first comparator 502 when the first and second comparators 502, 504 comprise PMOS transistors. This may be accomplished by adjusting the width of one or more transistors in either of the first comparator 502 or second comparator 504, or both. Typically, for one of the transistor threshold voltages to dominate the determination of the overall threshold voltage, the width of one of the transistors may be 2 or 4 times the width of the other transistor. Further, the threshold voltage of the second comparator 504 may be approximately midway between VDD and VSS (such as 2.5V) so that the second comparator 504 triggers after the first comparator 502 has triggered. As shown in FIG. 10, the second comparator 504 triggers at point "B" during the steep slope of curve 1006.

Figure 6:
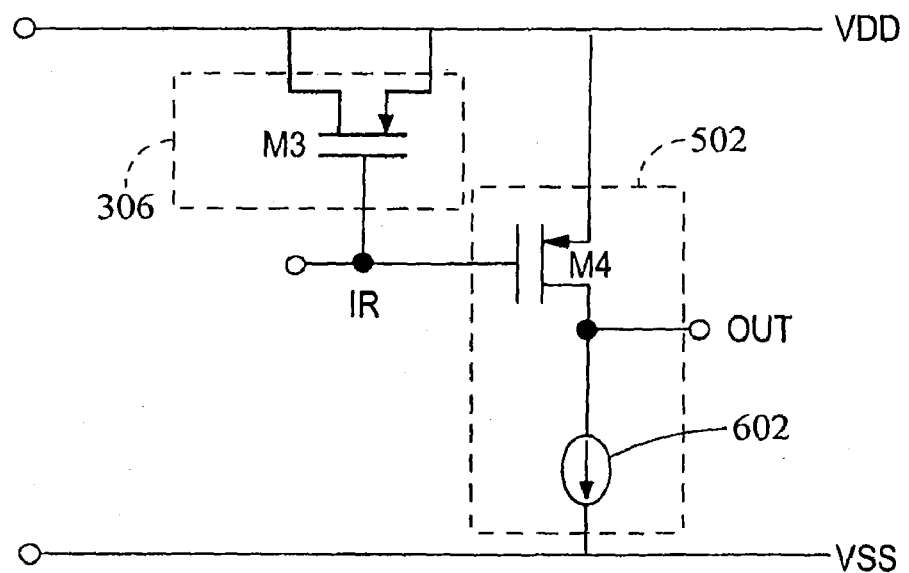
FIG. 6 is a circuit diagram of the discharge capacitor and the first comparator depicted in FIG. 5.

Referring to FIG. 6, there is shown one example of the variable capacitor 306 and the first comparator 502. As shown in FIG. 6, the variable capacitor 306 may comprise a PMOS transistor M3, with both its source and drain connected to VDD and its gate connected to node IR. As discussed above, a transistor, such as a PMOS or NMOS transistor, may be used for the variable capacitor 306. The capacitance of the transistor M3 may depend on the threshold voltage of the transistor M3. For example, the Meyer model of capacitance for the transistor depicts the capacitances in the transistor as $C_{GS}$ (gate to source), $C_{GD}$ (gate to drain), $C_{GB}$ (gate to body), $C_{JS}$ (source to substrate), and $C_{JD}$ (drain to substrate). In the various regions of operation (such as accumulation, subthreshold, linear, and saturation regions), the capacitance of the transistor may be approximated using the Meyer model. In the linear region (the transistor M3 acts as a capacitor for discharging purposes), the capacitance is dependent on the threshold voltage ($V_t$) of the transistor M3. The Meyer model of capacitance is described merely for illustrative purposes, and other models of capacitance for the transistor M3 may be used.

FIG. 6 further shows the first comparator 502 as including PMOS transistor M4 and current source 602. Other types of comparators may be used. As shown in FIG. 6, the structure and operation of the variable capacitor 306 and the first comparator 502 are similar due to similarities in transistors M3 and M4. Structurally, transistors M3 and M4 are both PMOS transistors, with similar characteristics, such as the threshold voltage ($V_t$), the channel length, etc. Thus, the threshold voltage of the variable capacitor 306 is substantially the same as the threshold voltage for the first comparator 502. Further, the gate of transistor M4 is connected to the gate of transistor M3 at node IR. As a result, in operation, the gate to source voltage for transistor M3 is substantially the same as the gate to source voltage of transistor M4.

Figure 7:
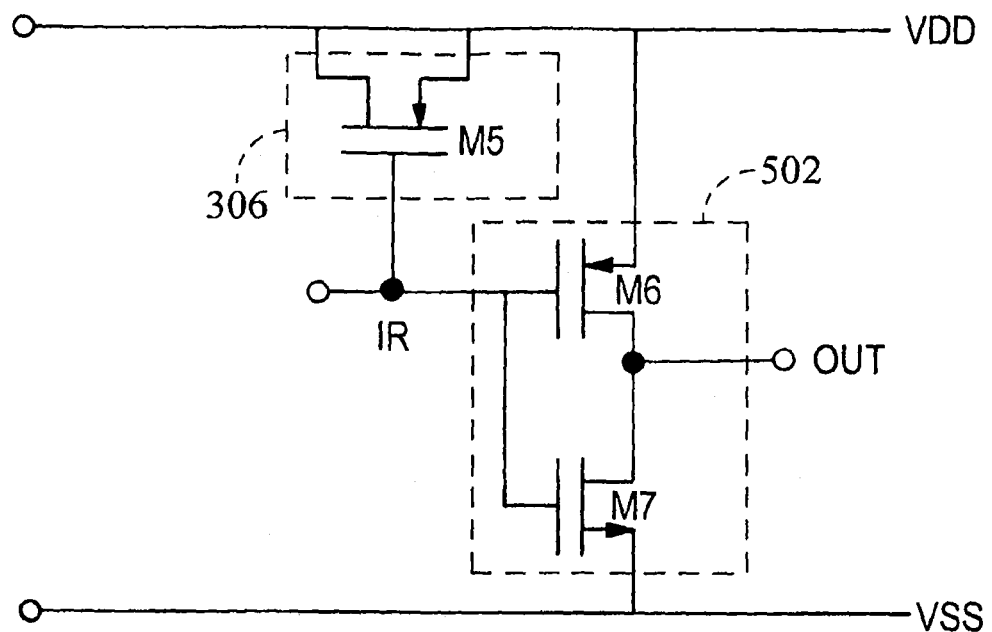
FIG. 7 is a circuit diagram one example of the second comparator depicted in FIG. 5.

Referring to FIG. 7, there is shown another example of the variable capacitor 306 and the first comparator 502. As shown in FIG. 7, the variable capacitor may comprise a PMOS transistor M5, with both its source and drain connected to VDD and its gate connected to node IR. FIG. 7 further shows the first comparator 502 as including PMOS transistor M6 and NMOS transistor M7. The threshold voltage for the M6 and M7 transistor combination may be determined by the sizes of transistors M6 and M7. In the case where transistor M6 is much larger than transistor M7 (such as three times larger), the threshold voltage for the combination will be dominated by the threshold voltage of transistor M6. Thus, similar to FIG. 6, the variable capacitor 306 has similarities with the first comparator 502. For example, both the variable capacitor 306 and the first comparator 502 have similar circuit elements (such as each having a PMOS transistor). Further, both have similar threshold voltages (the variable capacitor 306 having a threshold voltage of the PMOS transistor M5 and the first comparator having a threshold that is close to the threshold of the PMOS transistor M6). Finally, the gate to source voltage is substantially the same for the variable capacitor 306 and the PMOS transistor M6 in the first comparator 502 (i.e., substantially the same gate to source voltage across transistors M5 and M6).

Figure 8:
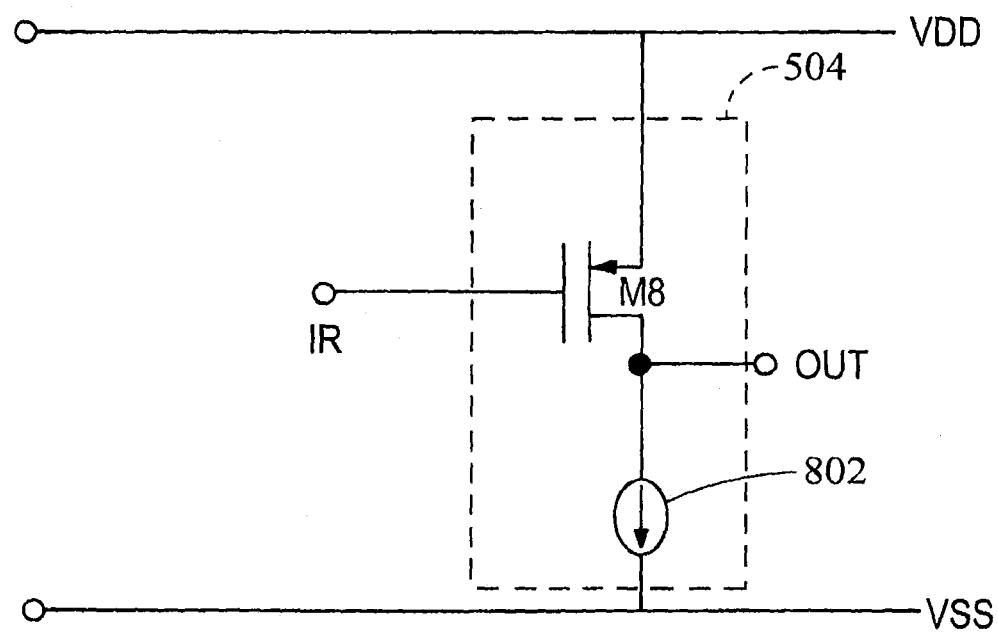
FIG. 8 is a circuit diagram of another example of the second comparator depicted in FIG. 5.

Referring to FIG. 8, there is shown an example of the second comparator 504. The second comparator 504 may include a transistor M8 and a current source 802. As discussed above, the threshold voltage to trigger an output for the second comparator 504 may be different from the threshold voltage to trigger an output for the first comparator 502. For example, the threshold voltage of transistor M8 may be selected to be less than the threshold voltage of transistor M4 in FIG. 6. In this manner, transistor M8 will turn on later than transistor M4 when node IR is discharging. Alternatively, the second comparator 504 may comprise multiple transistors, such as transistors M6 and M7, as shown in FIG. 7. The sizes for the transistors M6 and M7 may be selected such that the threshold voltage for the combination is in the middle between VDD and VSS.

Referring to FIG. 9, there is shown one example of the speeding logic 506. As discussed above, the speeding logic 506 may act as a feedback between the output of the first comparator 502 and node IR, and may quicken the discharge of the variable capacitor 306 by pulling node IR down to VSS quickly. As shown in FIG. 9, the speeding logic 506 receives as an input signal the output from the first comparator 502, which is sent to two inverters in series 902, 904. The output of inverter 902 is connected to the gate of transistor M9. When the output from the first comparator 502 goes HIGH, the output of inverter 902 goes HIGH turning on transistor M9 and pulling node IR down to VSS. The inverters 902, 904 may be conventional inverters sufficient to drive transistor M9. Further, transistor M9 may have a very small output impedance so that it may quickly pull down node IR. Further, the size of transistor M9 may be modified to adjust the speed at which node IR is pulled down.

Figure 11:
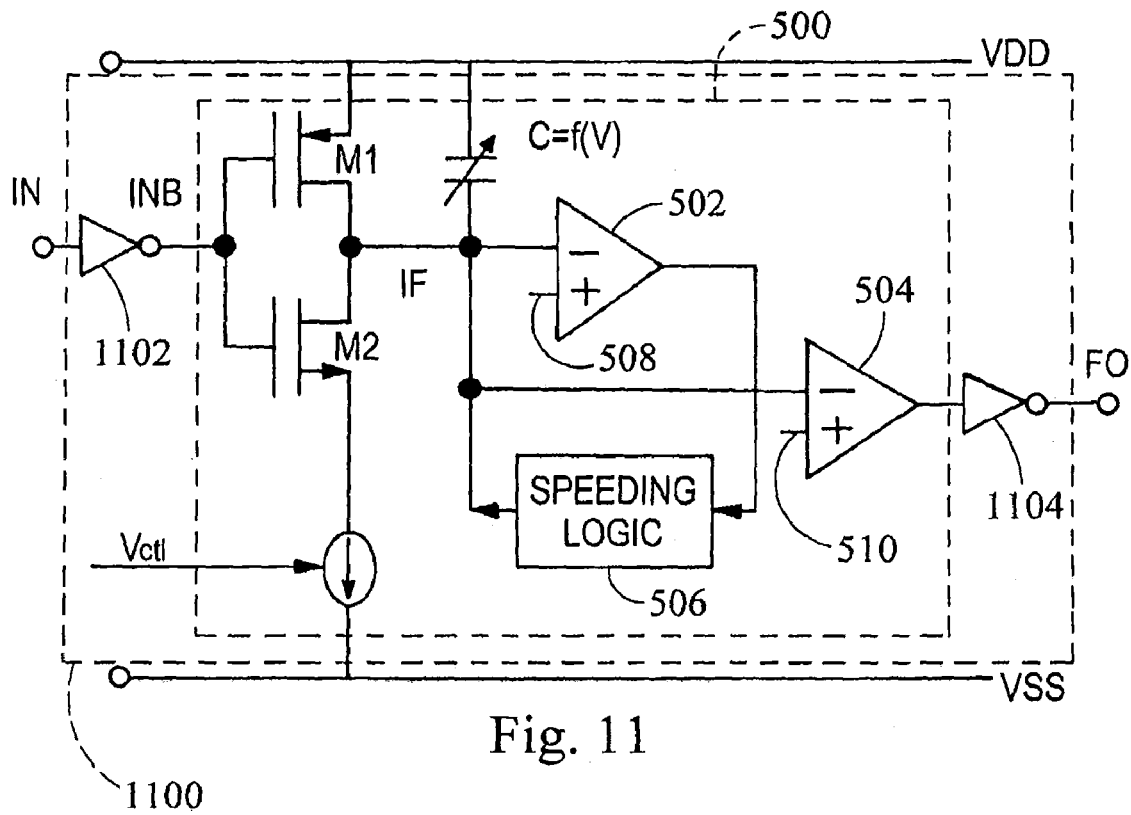
FIG. 11 is a circuit diagram of a falling edge delay cell according to the embodiment depicted in FIG. 3.

FIG. 5 depicts rising edge delay cell 500. Oftentimes, both the rising edge and the falling edge of a signal may be delayed. FIG. 11 depicts a circuit diagram of a falling edge delay cell 1100 according to the embodiment depicted in FIG. 3. FIG. 11 includes elements similar to that described in the rising edge delay cell 500 shown in FIG. 5, highlighted by the dashed box in FIG. 11. In addition, falling edge delay cell 1100 includes two additional inverters 1102, 1104, with one inverter 1102 coupled to the input (IN) and generating an inverted signal to the input (INB). The inverted signal (INB) may then be input to circuit elements for the rising edge delay cell 500.

Further, as shown in FIG. 11, the node coupling the variable capacitor 306 and the first comparator 502 is designated as node IF. One or both of the inverters 1102, 1104 may be small for fast execution of the inverters. For example, in order to avoid creating significant additional delay in the falling edge delay cell 1100, inverter 1102 may be made fast so that generating signal (INB) does not add significant time to the operation of the falling edge delay cell 1100. Alternatively, other portions of the falling edge delay cell 1100 may be modified to compensate for the additional time necessary to operate inverters 1102, 1004 in the falling edge delay cell 1100. For example, transistors M1, M2, speeding logic 506, or other components may be made to operate quicker to compensate for the additional delay caused by the inverters 1102, 1104.

Figure 12:
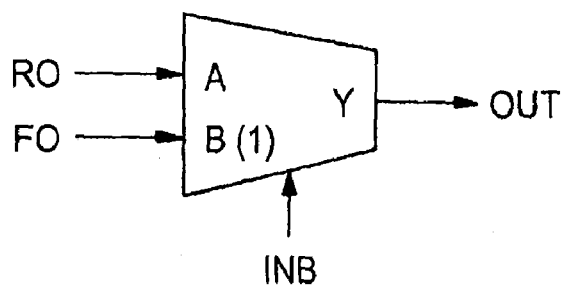
FIG. 12 is a logic diagram combining the output signals for the circuit diagrams from FIG. 5 and FIG. 11.

The final delay output signal may be a combination of the outputs from the rising edge delay cell 500 and the falling edge delay cell 1100. Specifically, the rising edge output of the rising edge delay cell 500 and the falling edge output of the falling edge delay cell 1100, RO and FO, respectively, may be combined using a 2-to-1 selector to generate the final delay output signal. FIG. 12 is a logic diagram combining the output signals (RO, FO) for the circuit diagrams from FIG. 5 and FIG. 11. The logic diagram in FIG. 12 may represent circuitry for the following logic:

$$OUT = RO \cdot \overline{INB} + FO \cdot INB \quad (3)$$

where $\overline{INB}$ is the inverse of INB. Thus, when the input signal (IN) is HIGH (logic 1), the logic diagram depicted in FIG. 12 is configured to generate output (OUT) equal to RO. When the input signal (IN) is LOW (logic 0), the logic diagram is configured to generate output (OUT) equal to FO.

Using both of the rising edge and falling edge delay cells 500, 1100 enables both the rising and falling edges of the input signal to be delayed. Thus, the entire input signal may be delayed, and the duty cycle of the input signal may further be maintained. In particular, the duty cycle may be kept constant since both rising and falling edge pass through the same delay time.

Another aspect of the invention includes the ability to program a delay time for one or more of the delay cells. The operation of a delay cell, including rising edge delay cell 500 and falling edge delay cell 1100, may depend on the rate at which the capacitor, such as variable capacitor 306, discharges. As shown in FIGS. 5 and 11, the rate at which variable capacitor 306 discharges is dependent on the current $I_{REF}$. The higher the $I_{REF}$, the quicker variable capacitor 306 discharges, and the lower the $I_{REF}$, the slower variable capacitor 306 discharges. Thus, modifying the current in current source 304 in FIG. 3 and current source 404 in FIG. 4 may modify the delay generated by the delay cells.

FIG. 13 shows one example of a circuit that generates a control signal ($V_{ctl}$) that may be used as an input to current source 304 or current source 404 to control the current output. FIG. 13 discloses a digitally controlled current-to-voltage converter 1300. Current source ICC may be a precise on-chip reference current source or off-chip reference current source which determines the accuracy of the delay time. The converter 1300 may receive a digital control signal, as shown in FIG. 13. The digital control signal may comprise a plurality of signal components or bits, with each signal component comprising a HIGH (or logic 1) or a LOW (or logic 0) value. The digital control signal may turn on or off the branches 1302. Specifically, if a "bit" of the digital control signal is HIGH, then the branch 1302 is turned on. For example, if there are five branches, a digital control signal of 00001 results in only one branch 1302 being turned on, so that all of the current from current source ICC flows through that one branch 1302. As another example, for the five-branch circuit, a digital control signal of 11111 results in all five branches 1302 being turned on, so that the current source ICC is divided among the five branches 1302, with ⅕ of the ICC current flowing through each branch 1302. The number of branches that are turned on determines the control signal ($V_{ctl}$). Turning on more branches results in a lower current in each branch, which, in turn, effects a lower $V_{ctl}$.

The circuitry used to generate the current, generally designated as $I_{REF}$ in FIGS. 5 and 11, may be the same as branch 1302. Thus, if the control signal ($V_{ctl}$) is applied to branch 1302, the circuitry acts as a current mirror, generating the same current that is generated in the branches 1302 that are turned on in FIG. 13. The current generated by current source 304 in FIG. 3, current source 404 in FIG. 4, $I_{REF}$ in FIG. 5 or $I_{REF}$ in FIG. 11 may be determined based on a digital control signal. In this manner, the amount of current that is used to discharge the variable capacitor 306 may be modified, such as by using a programmable digital control input. In turn, the amount of the delay that the delay cells generate may also be varied. Because of this, a single delay cell may be used to generate a delay. This is an improvement over delay circuits that relied on multiple cascaded cells to generate an overall delay. Because error was caused by each delay cell, the overall error for the delay circuit (and the non-linearity of the error) would increase as the number of cells used in the delay circuit increased.

As illustrated in FIG. 13, a digitally controlled current-to-voltage converter 1300 is used to generate the control signal ($V_{ctl}$). However, it should be understood that other circuits may be used to generate a control signal usable by the delay cell to determine the current that is to be used to discharge the capacitor. For example, rather than having multiple branches, a single branch with a variable resistance may be used with the variable resistance being dependent on the control signal.

It is contemplated that the programmable delay circuits described above may be implemented in any of a number of electronic devices to delay a rising edge, a falling edge, or both, of a signal. The programmable delay circuits may be integrated in such electronic devices to delay signals. By implementing the rising edge delay cell 500 and/or the falling edge delay cell 1100, it is contemplated that a signal (including the rising and the falling edges of the signal) may be delayed and that the duty cycle of the signal may be maintained. Such a delay circuit may be manufactured as an integrated circuit package that may be used for a number of different devices, and that may provide for implementation in devices having user adjustable modes that allow for adjustment of the delay based on different inputs for the digital control signal (such as shown in FIG. 13).

Figure 16B:
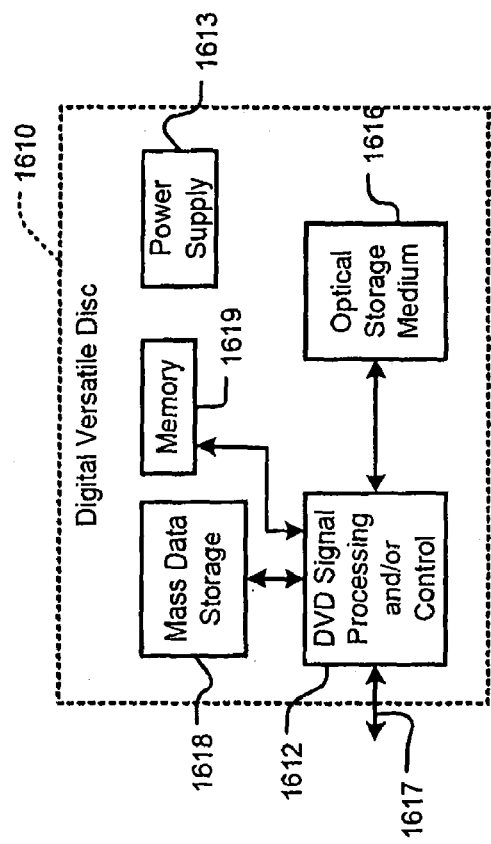
FIG. 16B is a functional block diagram of a digital versatile disk (DVD)
Figure 16A:
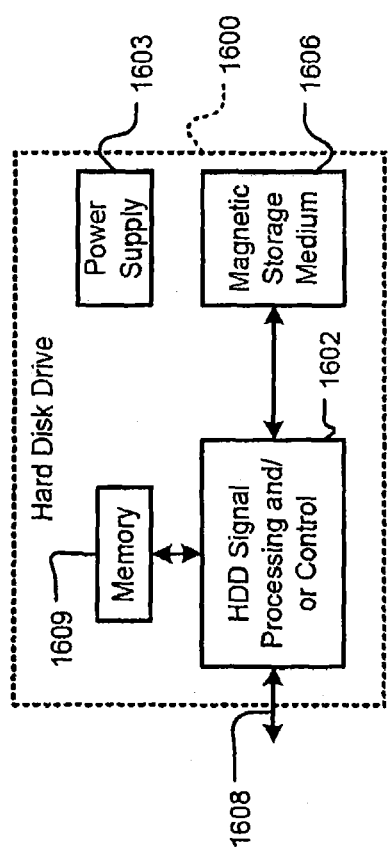
FIG. 16A is a functional block diagram of a hard disk drive.

Referring now to FIGS. 16A-16G, various exemplary implementations of the present invention are shown. As shown in FIG. 16A, the present invention can be implemented in a hard disk drive (HDD) 1600. The delay circuit of the present invention may be implemented in either or both signal processing and/or control circuits 1602 and/or a power supply 1603. In some implementations, the signal processing and/or control circuit 1602 and/or other circuits (not shown) in the HDD 1600 may process data, perform coding and/or encryption, perform calculations, and/or format data that is output to and/or received from a magnetic storage medium 1606.

The HDD 1600 may communicate with a host device (not shown) such as a computer, mobile computing devices such as personal digital assistants, cellular phones, media or MP3 players and the like, and/or other devices via one or more wired or wireless communication links 1608. The HDD 1600 may be connected to memory 1609 such as random access memory (RAM), low latency nonvolatile memory such as flash memory, read only memory (ROM) and/or other suitable electronic data storage.

Referring now to FIG. 16B, the present invention can be implemented in a digital versatile disc (DVD) drive 1610. The delay circuit of the present invention may be implemented in either or both signal processing and/or control circuits, which are generally identified in FIG. 16B at 1612, mass data storage of the DVD drive 1610 and/or a power supply 1613. The signal processing and/or control circuit 1612 and/or other circuits (not shown) in the DVD drive 1610 may process data, perform coding and/or encryption, perform calculations, and/or format data that is read from and/or data written to an optical storage medium 1616. In some implementations, the signal processing and/or control circuit 1612 and/or other circuits (not shown) in the DVD drive 1610 can also perform other functions such as encoding and/or decoding and/or any other signal processing functions associated with a DVD drive.

The DVD drive 1610 may communicate with an output device (not shown) such as a computer, television or other device via one or more wired or wireless communication links 1617. The DVD drive 1610 may communicate with mass data storage 1618 that stores data in a nonvolatile manner. The mass data storage 1618 may include a hard disk drive (HDD). The HDD may have the configuration shown in FIG. 16A. The HDD may be a mini HDD that includes one or more platters having a diameter that is smaller than approximately 1.8" The DVD drive 1610 may be connected to memory 1619 such as RAM, ROM, low latency nonvolatile memory such as flash memory and/or other suitable electronic data storage.

Figure 16D:
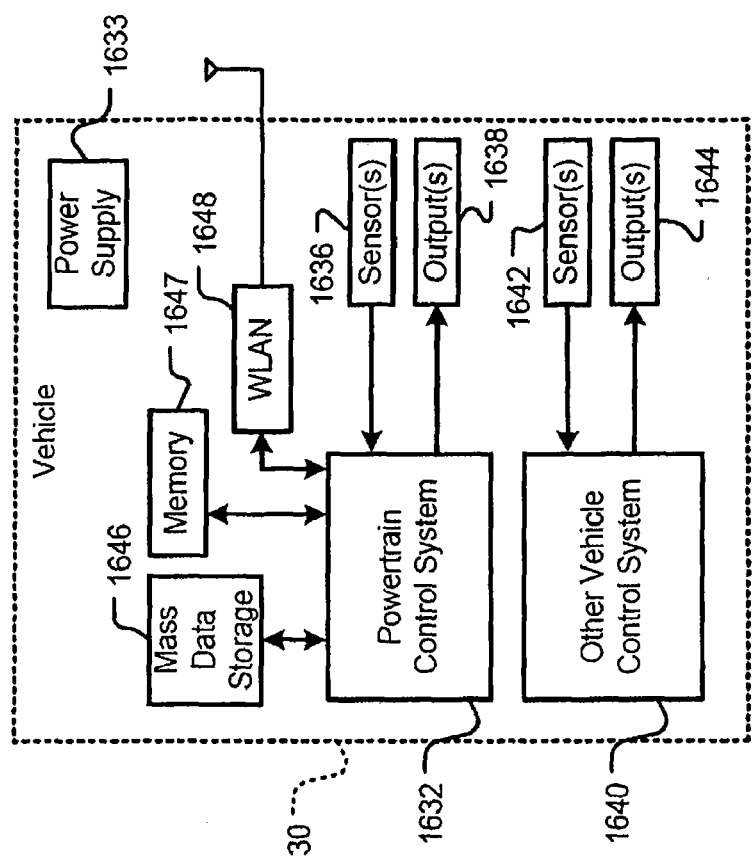
FIG. 16D is a functional block diagram of a vehicle control system.
Figure 16C:
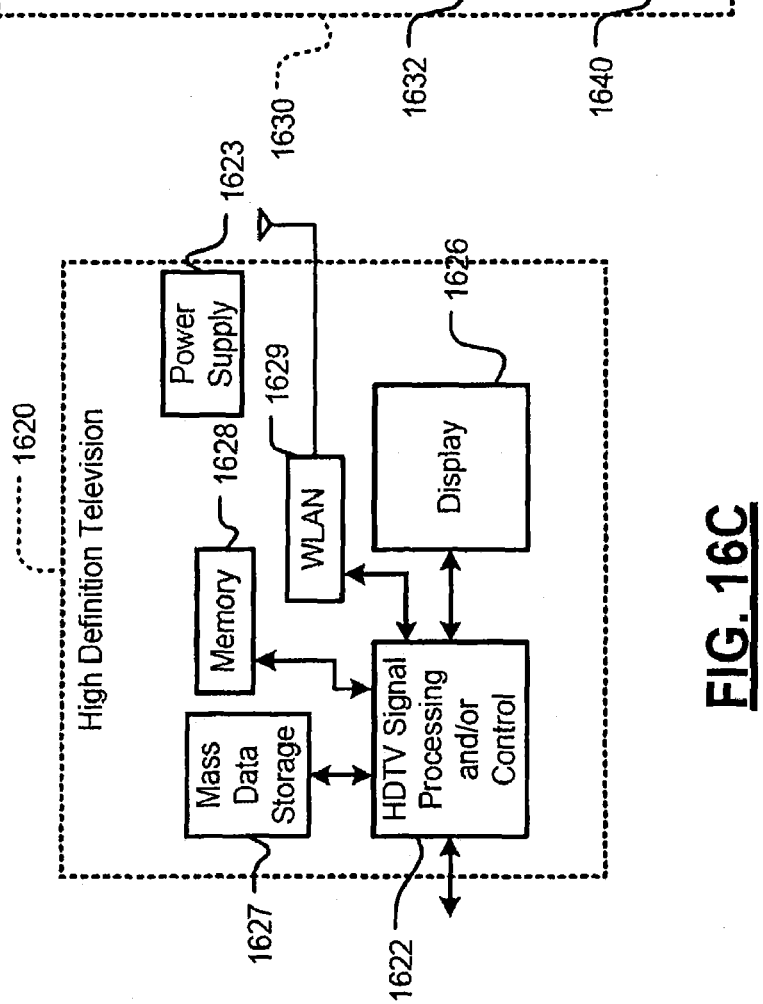
FIG. 16C is a functional block diagram of a high definition television.

Referring now to FIG. 16C, the present invention can be implemented in a high definition television (HDTV) 1620. The delay circuit of the present invention may be implemented in either or both signal processing and/or control circuits, which are generally identified in FIG. 16E at 1622, a WLAN interface 1629, mass data storage 1627 of the HDTV 1620 and/or a power supply 1623. The HDTV 1620 receives HDTV input signals in either a wired or wireless format and generates HDTV output signals for a display 1626. In some implementations, signal processing circuit and/or control circuit 1622 and/or other circuits (not shown) of the HDTV 1620 may process data, perform coding and/or encryption, perform calculations, format data and/or perform any other type of HDTV processing that may be required.

The HDTV 1620 may communicate with mass data storage 1627 that stores data in a nonvolatile manner such as optical and/or magnetic storage devices. At least one HDD may have the configuration shown in FIG. 16A and/or at least one DVD drive may have the configuration shown in FIG. 16B. The HDD may be a mini HDD that includes one or more platters having a diameter that is smaller than approximately 1.8". The HDTV 1620 may be connected to memory 1628 such as RAM, ROM, low latency nonvolatile memory such as flash memory and/or other suitable electronic data storage. The HDTV 1620 also may support connections with a WLAN via the WLAN interface 1629.

Referring now to FIG. 16D, the delay circuit of the present invention may be implemented in a control system of a vehicle 1630, a WLAN interface 1648, mass data storage 1646 of the vehicle control system and/or a power supply 1633. In some implementations, the present invention may be implemented in a powertrain control system 1632 that receives inputs from one or more sensors 1636 such as temperature sensors, pressure sensors, rotational sensors, airflow sensors and/or any other suitable sensors. The powertrain control system 1632 may generate one or more output control signals 1638 such as engine operating parameters, transmission operating parameters, and/or other control signals.

The present invention may also be implemented in other control systems 1640 of the vehicle 1630. The control system 1640 may likewise receive signals from input sensors 1642 and/or output control signals to one or more output devices 1644. In some implementations, the control system 1640 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1632 may communicate with mass data storage 1646 that stores data in a nonvolatile manner. The mass data storage 1646 may include optical and/or magnetic storage devices, such as HDDs and/or DVD drives. At least one HDD may have the configuration shown in FIG. 16A and/or at least one DVD drive may have the configuration shown in FIG. 16B. The HDD may be a mini HDD that includes one or more platters having a diameter that is smaller than approximately 1.8". The powertrain control system 1632 may be connected to memory 1647 such as RAM, ROM, low latency nonvolatile memory such as flash memory and/or other suitable electronic data storage. The powertrain control system 1632 also may support connections with a WLAN via the WLAN interface 1648. The control system 1640 may also include mass data storage, memory and/or a WLAN interface (all not shown).

Figure 16E:
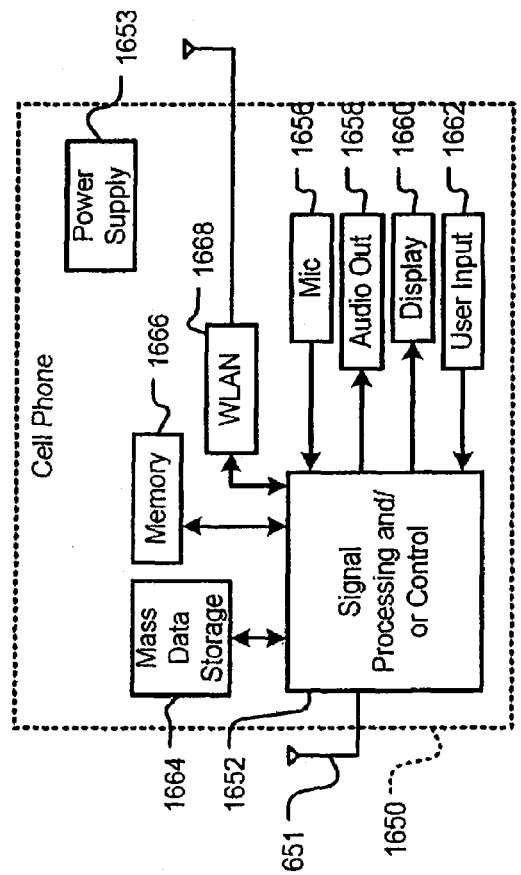
FIG. 16E is a functional block diagram of a cellular phone.

Referring now to FIG. 16E, the present invention can be implemented in a cellular phone 1650 that may include a cellular antenna 1651. The delay circuit of the present invention may be implemented in either or both signal processing and/or control circuits, which are generally identified in FIG. 16E at 1652, a WLAN interface 1668, mass data storage 1664 of the cellular phone 1650 and/or a power supply 1653. In some implementations, the cellular phone 1650 includes a microphone 1656, an audio output 1658 such as a speaker and/or audio output jack, a display 1660 and/or an input device 1662 such as a keypad, pointing device, voice actuation and/or other input device. The signal processing and/or control circuits 1652 and/or other circuits (not shown) in the cellular phone 1650 may process data, perform coding and/or encryption, perform calculations, format data and/or perform other cellular phone functions.

The cellular phone 1650 may communicate with mass data storage 1664 that stores data in a nonvolatile manner such as optical and/or magnetic storage devices, such as, HDDs and/or DVD drives. At least one HDD may have the configuration shown in FIG. 16A and/or at least one DVD drive may have the configuration shown in FIG. 16B. The HDD may be a mini HDD that includes one or more platters having a diameter that is smaller than approximately 1.8". The cellular phone 1650 may be connected to memory 1666 such as RAM, ROM, low latency nonvolatile memory such as flash memory and/or other suitable electronic data storage. The cellular phone 1650 also may support connections with a WLAN via the WLAN interface 1668.

Figure 16F:
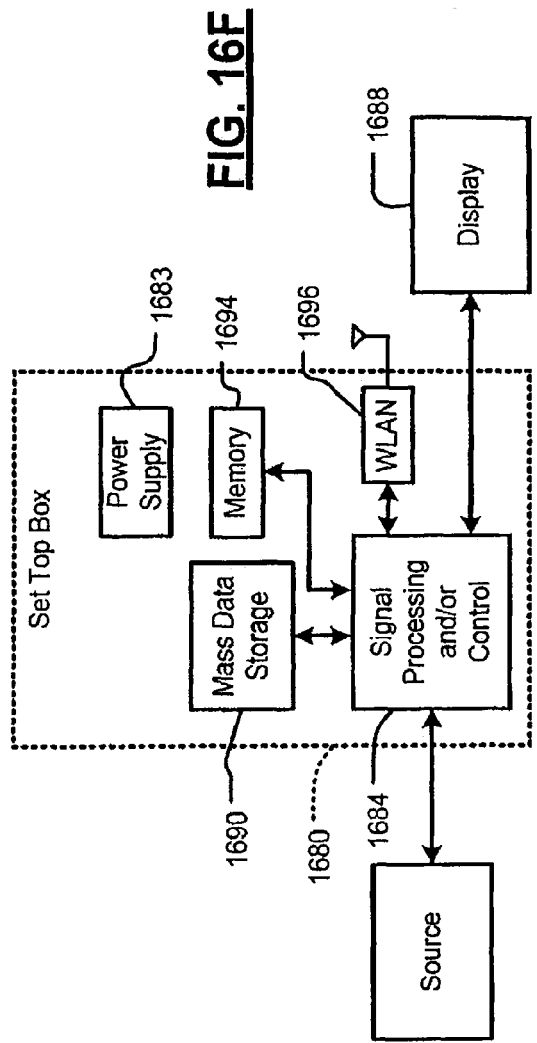
FIG. 16F is a functional block diagram of a set top box.

Referring now to FIG. 16F, the present invention can be implemented in a set top box 1680. The delay circuit present invention may be implemented in either or both signal processing and/or control circuits, which are generally identified in FIG. 16F at 1684, a WLAN interface 1696, mass data storage 1690 of the set top box 1680 and/or a power supply 1683. The set top box 1680 receives signals from a source such as a broadband source and outputs standard and/or high definition audio/video signals suitable for a display 1688 such as a television, a monitor and/or other video and/or audio output devices. The signal processing and/or control circuits 1684 and/or other circuits (not shown) of the set top box 1680 may process data, perform coding and/or encryption, perform calculations, format data and/or perform any other set top box functions.

The set top box 1680 may communicate with mass data storage 1690 that stores data in a nonvolatile manner. The mass data storage 1'690 may include optical and/or magnetic storage devices, such as, HDDs and/or DVD drives. At least one HDD may have the configuration shown in FIG. 16A and/or at least one DVD drive may have the configuration shown in FIG. 16B. The HDD may be a mini HDD that includes one or more platters having a diameter that is smaller than approximately 1.8". The set top box 1680 may be connected to memory 1694 such as RAM, ROM, low latency nonvolatile memory such as flash memory and/or other suitable electronic data storage. The set top box 1680 also may support connections with a WLAN via the WLAN interface 1696.

Figure 16G:
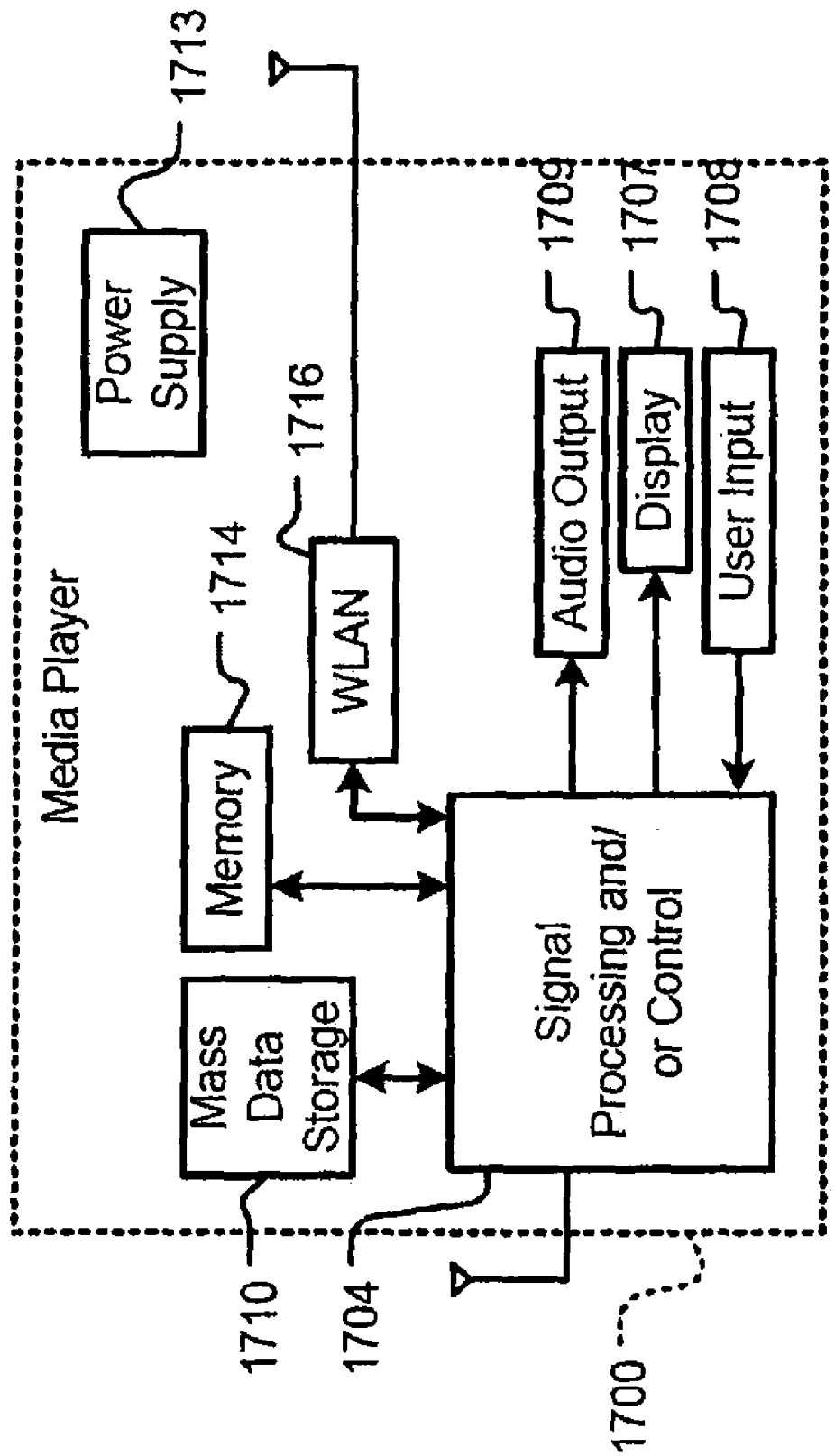
FIG. 16G is a functional block diagram of a media player.

Referring now to FIG. 16G, the present invention can be implemented in a media player 1700. The delay circuit of the present invention may be implemented in either or both signal processing and/or control circuits, which are generally identified in FIG. 16G at 1704, a WLAN interface 1716, mass data storage 1710 of the media player 1700 and/or a power supply 1703. In some implementations, the media player 1700 includes a display 1707 and/or a user input 1708 such as a keypad, touchpad and the like. In some implementations, the media player 1700 may employ a graphical user interface (GUI) that typically employs menus, drop down menus, icons and/or a point-and-click interface via the display 1707 and/or user input 1708. The media player 1700 further includes an audio output 1709 such as a speaker and/or audio output jack. The signal processing and/or control circuits 1704 and/or other circuits (not shown) of the media player 1700 may process data, perform coding and/or encryption, perform calculations, format data and/or perform any other media player functions.

The media player 1700 may communicate with mass data storage 1710 that stores data such as compressed audio and/or video content in a nonvolatile manner. In some implementations, the compressed audio files include files that are compliant with MP3 format or other suitable compressed audio and/or video formats. The mass data storage 1710 may include optical and/or magnetic storage devices, such as, HDDs and/or DVD drives. At least one HDD may have the configuration shown in FIG. 16A and/or at least one DVD drive may have the configuration shown in FIG. 16B. The HDD may be a mini HDD that includes one or more platters having a diameter that is smaller than approximately 1.8". The media player 1700 may be connected to memory 1714 such as RAM, ROM, low latency nonvolatile memory such as flash memory and/or other suitable electronic data storage. The media player 1700 also may support connections with a WLAN via the WLAN interface 1716. Still other implementations in addition to those described above are contemplated.

It is intended that the foregoing detailed description be understood as an illustration of selected forms that the invention can take and not as a definition of the invention. It is only the following claims, including all equivalents, that are intended to define the scope of this invention.

I claim:

1. A delay circuit for delaying an input signal, the delay circuit comprising:
    a capacitor having a capacitance and discharging in response to the input signal; and
    a triggering circuit in communication with the capacitor, the triggering circuit generating an output when a voltage across the capacitor reaches a triggering level,
    wherein the capacitance depends on a threshold voltage and the triggering level depends on the threshold voltage, and
    wherein the capacitance is inversely related to the threshold voltage and the triggering level is directly related to the threshold voltage such that the capacitance compensates for changes in the triggering level.

2. The delay circuit of claim 1, wherein the capacitor includes a MOS transistor having a source and a drain coupled together.

3. The delay circuit of claim 2, wherein the capacitance of the capacitor is variable depending on a voltage applied between a gate and the source of the MOS transistor.

4. The delay circuit of claim 3, wherein the MOS transistor comprises a first MOS transistor;
    wherein the triggering circuit includes a second MOS transistor; and
    wherein the gate of the first MOS transistor is electrically coupled to a gate of the second MOS transistor.

5. The delay circuit of claim 4, wherein a voltage between the gate and the source of the first MOS transistor is equal to a voltage between the gate and a source of the second MOS transistor.

6. The delay circuit of claim 1, wherein the capacitor comprises a first MOS transistor and the triggering circuit comprises a second MOS transistor.

7. The delay circuit of claim 6, wherein the first MOS transistor and the second MOS transistor are produced from a substantially similar fabrication process.

8. The delay circuit of claim 1, wherein the triggering circuit comprises a first comparator and a second comparator each connected to the capacitor.

9. The delay circuit of claim 1, wherein the triggering level depends on an ambient temperature in a manner inversely related to a manner that the capacitance depends on the ambient temperature.

10. A method for delaying an input signal comprising:
    discharging a capacitor having a capacitance when the input signal is detected; and
    generating an output at a triggering circuit when a voltage across the discharging capacitor reaches a triggering voltage,
    wherein the capacitance is inversely related to a threshold voltage and the triggering voltage is directly related to the threshold voltage.

11. The method of claim 10, wherein the capacitor includes a MOS transistor having a source and a drain coupled together.

12. The method of claim 11, wherein the capacitance of the capacitor is variable depending on a voltage applied between a gate and the source of the MOS transistor.

13. The method of claim 12, wherein the MOS transistor comprises a first MOS transistor;
    wherein the triggering circuit includes a second MOS transistor;
    wherein the gate of the first MOS transistor is electrically coupled to a gate of the second MOS transistor.

14. The method of claim 13, wherein a voltage between the gate and the source of the first MOS transistor is equal to a voltage between the gate and a source of the second MOS transistor.

15. The method of claim 10, wherein the capacitor comprises a first MOS transistor and the triggering circuit comprises a second MOS transistor.

16. The method of claim 15, wherein the first MOS transistor and the second MOS transistor are produced during a same fabrication process.

17. The method of claim 16, wherein the triggering circuit comprises a first comparator and a second comparator each connected to the capacitor.

18. The method of claim 10, wherein the triggering voltage depends on an ambient temperature in a manner inversely related to a manner that the capacitance depends on the ambient temperature.

19. A delay circuit for delaying an input signal, the delay circuit comprising:
    a discharging circuit comprising a first transistor having a capacitance inversely related to a threshold voltage of the first transistor; and
    a triggering circuit comprising a second transistor in communication with the discharging circuit, the triggering circuit generating an output when the discharging circuit reaches a triggering level directly related to a threshold voltage of the second transistor, wherein the threshold voltage of the first transistor equals the threshold voltage of the second transistor.

20. The delay circuit of claim 19, wherein the threshold voltage of the first transistor is approximately equivalent to the threshold voltage of the second transistor.

* * * * *